United States Patent
Kale et al.

(10) Patent No.: US 8,380,914 B1
(45) Date of Patent: Feb. 19, 2013

(54) EXTENDED ADDRESS MODE FOR SERIAL FLASH MEMORY

(75) Inventors: Poorna Kale, Folsom, CA (US); Chris Bueb, Folsom, CA (US); Todd Legler, Shingle Springs, CA (US)

(73) Assignee: Micron Technology, Inc., Boise, ID (US)

(*) Notice: Subject to any disclaimer, the term of this patent is extended or adjusted under 35 U.S.C. 154(b) by 768 days.

(21) Appl. No.: 12/347,623

(22) Filed: Dec. 31, 2008

(51) Int. Cl.
*G06F 13/00* (2006.01)
*G06F 13/28* (2006.01)

(52) U.S. Cl. ........ 711/2; 711/103; 711/1; 711/154; 711/170; 710/65; 365/185.05; 365/185.09

(58) Field of Classification Search .......... 711/103, 711/2, 1, 154, 170; 710/65; 365/185.05, 365/185.09
See application file for complete search history.

(56) References Cited

U.S. PATENT DOCUMENTS

| | | | |
|---|---|---|---|
| 7,343,470 B1 * | 3/2008 | Joyce et al. | 711/218 |
| 2003/0196077 A1 * | 10/2003 | Henry et al. | 712/245 |
| 2010/0174854 A1 * | 7/2010 | Kim | 711/103 |

OTHER PUBLICATIONS

MX25L1635D Datasheet, Macronix International Co., Ltd., Rev. 1.3, 50 pages, Jul. 8, 2008.
W25Q80, W25Q16, W25Q32 Winbond Spiflash, Preliminary—Revision B, 61 pages, Sep. 26, 2007.
Serial Quad I/O (SQI) Flash Memory SST26VF016/SST26VF032, Silicon Storage Technology, Inc., 34 pages, Apr. 2008.

* cited by examiner

*Primary Examiner* — Mardochee Chery
(74) *Attorney, Agent, or Firm* — Knobbe Martens Olson & Bear LLP

(57) ABSTRACT

Example embodiments for providing enhanced addressability for a serial flash memory device may comprise providing an extended addressing mode to enable access to a larger range of memory locations.

20 Claims, 7 Drawing Sheets

| S# 205 | | | | | | | |
|---|---|---|---|---|---|---|---|
| Byte # | 0 | 1 | 2 | 3 | 4 | 5 | 6 | ... |
| Number of Clock Cycles | 8 | 8 | 8 | 8 | 8 | 8 | 8 | ... |
| Information Type | Code | Address | Address | Address | Address | Data Out | Data Out | ... |
| DI 211 | Hi-Z | 7,...,0 | 31,...,24 | 23,...,16 | 15,...,8 | 7,...,0 | X | X | ... |
| DO 212 | Hi-Z | Hi-Z | Hi-Z | Hi-Z | Hi-Z | 15,...,8 | 7,...,0 | ... |

Figure 5

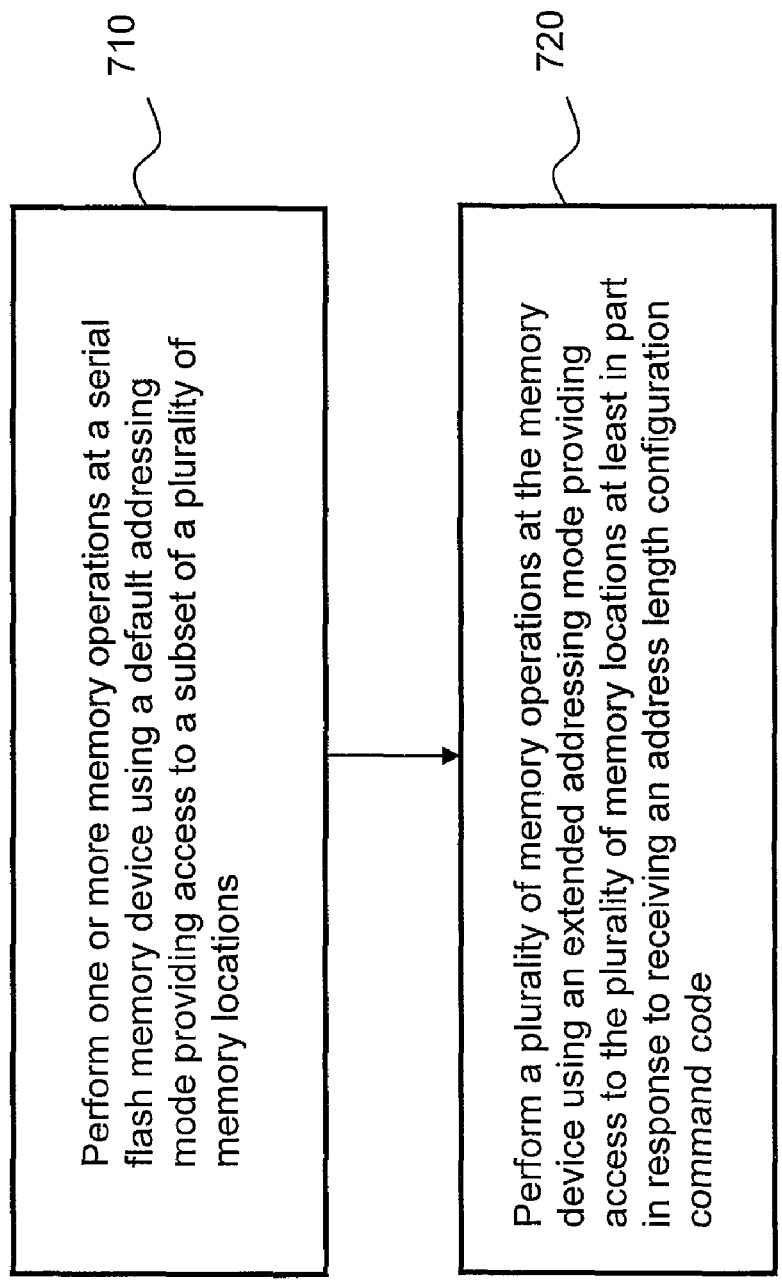

EXTENDED ADDRESS MODE FOR SERIAL FLASH MEMORY

BACKGROUND

1. Field

Subject matter disclosed herein may relate flash memory devices, and may relate more particularly to enhancing addressability for serial flash memory devices.

2. Information

Non-volatile memory devices, including flash memory devices, may be found in a wide range of electronic devices. In particular, flash memory devices may be used in computers, digital cameras, cellular telephones, personal digital assistants, etc. For many applications, flash memory devices may store instructions to be executed on a processor, and in at least some of these applications, the processor may fetch instructions from the flash memory devices, such as, for example, in execute-in-place (XiP) implementations. For these applications and others, the range of flash memory addresses, and therefore flash memory storage capacity, that is accessible to the processor or other system component may impact the range of possible applications that may benefit from flash memory.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

FIG. 5 is a schematic diagram of an example serial peripheral interface read operation using an example extended address;

FIG. 7 is a flow diagram of an example embodiment of a method for enhancing addressability for a serial flash memory device.

Figure 1:
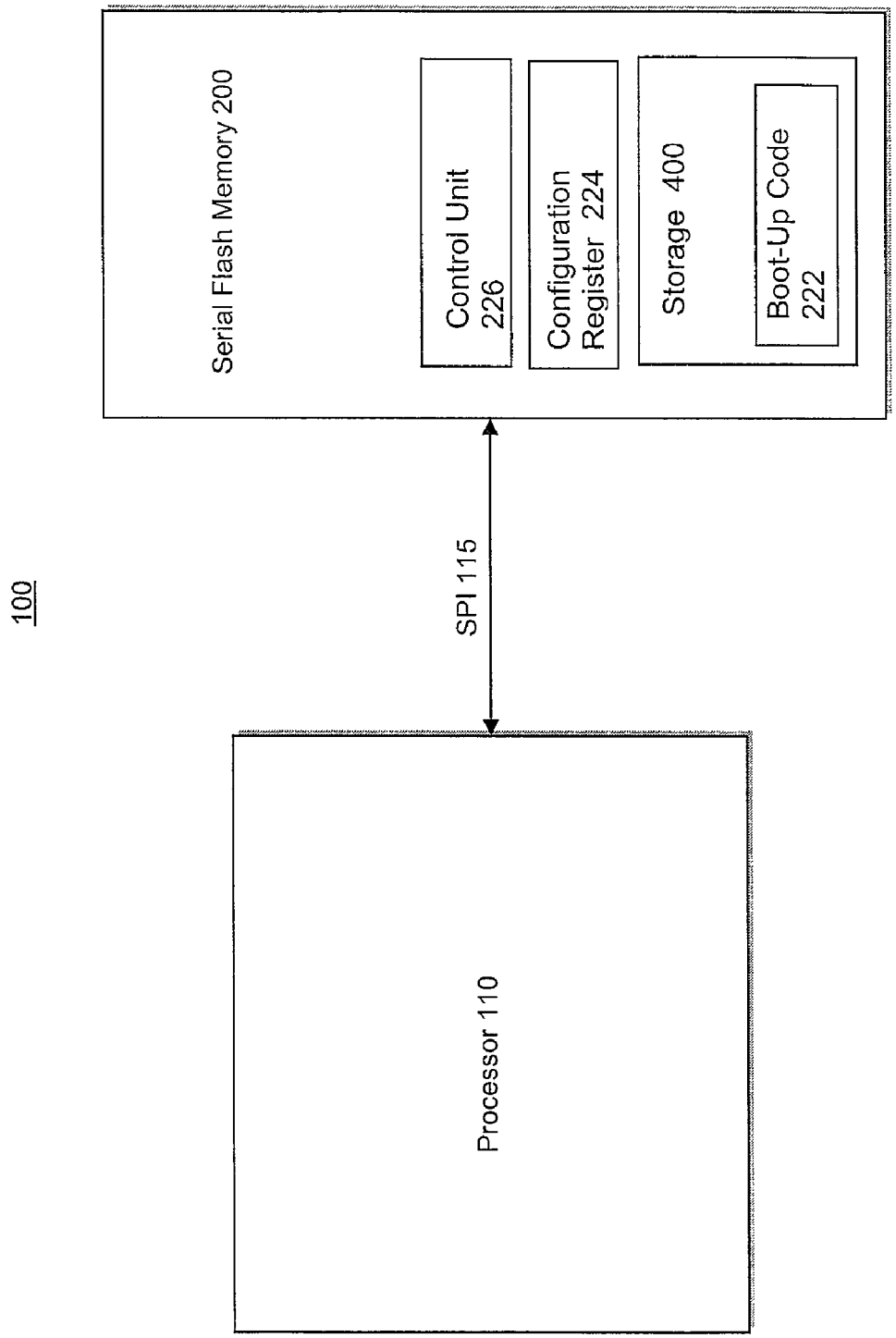
FIG. 1 is a schematic block diagram of an example embodiment of a computing platform including a serial flash memory device.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized. Furthermore, structural or logical changes may be made without departing from the scope of claimed subject matter. It should also be noted that directions or references, for example, up, down, top, bottom, and so on, may be used to facilitate discussion of the drawings and are not intended to restrict the application of claimed subject matter. Therefore, the following detailed description is not to be taken to limit the scope of claimed subject matter or their equivalents.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, methods, apparatuses or systems that would be known by one of ordinary skill have not been described in detail so as not to obscure claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification are not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

Likewise, the terms, "and," "and/or," and "or" as used herein may include a variety of meanings that also is expected to depend at least in part upon the context in which such terms are used. Typically, "or" as well as "and/or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe some combination of features, structures or characteristics. Though, it should be noted that this is merely an illustrative example and claimed subject matter is not limited to this example.

As discussed above, for many applications, flash memory devices may store instructions to be executed on a processor, and in at least some of these applications, the processor may fetch instructions from the flash memory devices, such as, for example, in execute-in-place (XiP) implementations. As used herein, the term "execute-in-place", along with its abbreviation "XiP", relates to a processor fetching instructions from a long term storage device, such as, for example, a flash memory, rather than fetching instructions from an intermediate storage, such as, for example, a dynamic random access memory (DRAM).

Flash memory may be characterized at least in part by the ability to be electrically erasable and programmable, and may be utilized in a very wide range of electronic device types, including, but not limited to, digital cameras, cellular telephones, personal digital assistants, portable navigation devices, portable music players, notebook computers, desktop computers, etc., to name but a few examples. Also, flash memory devices may comprise either parallel data interfaces or serial interfaces. Parallel interfaces, in at least some instances, may allow for relatively good data throughput due at least in part to increased numbers of input/output terminals. Serial interfaces, on the other hand, may provide reduced costs due at least in part to reduced numbers of input/output terminals. Serial flash memory devices may typically be addressed with a 24 bit address, for a total of 16M storage locations. For byte-wide devices, the total storage capacity may comprise a maximum of 128 Mb. For XiP applications and others, the relatively restricted range of addresses and storage capacity for typical serial flash memory devices may impact the range of applications that may benefit from serial flash memory technology.

As system designers seek to provide increased performance while reducing costs, it may be advantageous to enhance the addressability of serial flash memory devices by providing an extended addressing mode. It may also be advantageous to enhance addressability while maintaining compatibility with other devices that do not support the extended address mode. Embodiments described herein may enhance addressability, and therefore maximum storage capacity, of serial flash memory devices, while maintaining compatibility with devices that do not support extended addresses.

FIG. 1 is a block diagram of an example embodiment of a computing platform 100, comprising a processor 110 and a serial flash memory 200. Memory 200 for this example is coupled to processor 110 by way of a serial peripheral interface (SPI) 115, as discussed more fully below. For one or more embodiments, Serial Flash Memory 200 may comprise a control unit 226 and a configuration register 224. Memory 200 may also comprise a storage area 400 comprising a plurality of storage locations. Further, memory 200 may store boot-up code 222 that may comprise code that may be accessed by processor 110 upon a system start-up or reset. Storage 400 may also store instructions for any of a wide range of possible operating systems and/or applications, in an embodiment. Boot-up code 222 may be executed by processor 110. Note that for this example, processor 110 and memory 200 are configured as an execute-in-place (XiP) type implementation, where processor 110 may fetch instructions directly from a long-term storage device.

For one or more embodiments, control unit 226 may receive one or more signals from processor 110 and may generate one or more internal control signals to perform any of a number of operations, including data read operations, by which processor 110 may access boot-up code 222, for example. As used herein, the term "control unit" is meant to include any circuitry or logic involved in the management or execution of command sequences as they relate to flash memory devices.

The term "computing platform" as used herein refers to a system or a device that includes the ability to process or store data in the form of signals. Thus, a computing platform, in this context, may comprise hardware, software, firmware or any combination thereof. Computing platform 100, as depicted in FIG. 1, is merely one such example, and the scope of claimed subject matter is not limited in these respects. For one or more embodiments, a computing platform may comprise any of a wide range of digital electronic devices, including, but not limited to, personal desktop or notebook computers, high-definition televisions, digital versatile disc (DVD) players or recorders, game consoles, satellite television receivers, cellular telephones, personal digital assistants, mobile audio or video playback or recording devices, and so on. Further, unless specifically stated otherwise, a process as described herein, with reference to flow diagrams or otherwise, may also be executed or controlled, in whole or in part, by a computing platform. For the example embodiments described herein, computing platform 100 may comprise a cellular telephone, although again, the scope of claimed subject matter is not so limited.

Figure 2:
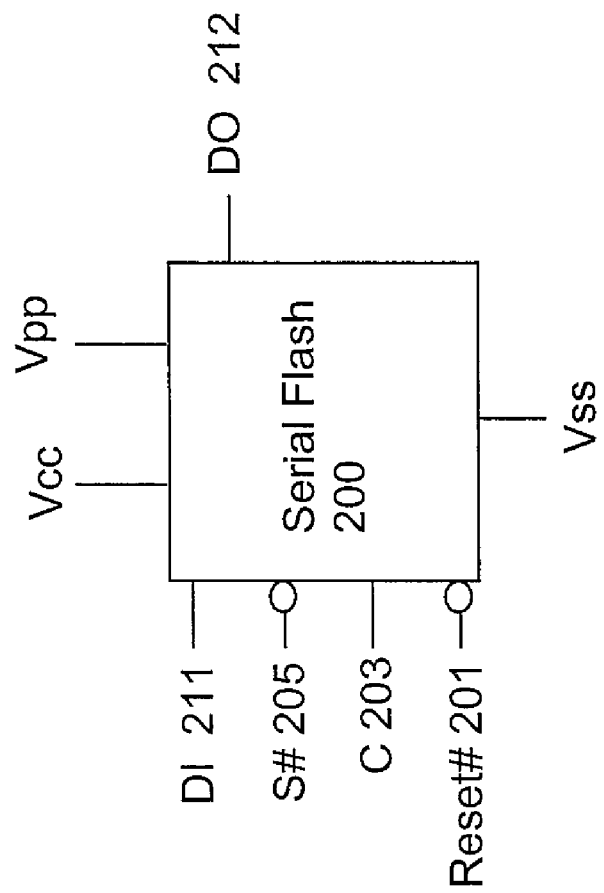
FIG. 2 is a schematic block diagram depicting an example embodiment of a serial flash memory device configured for single input and single output operation.

As mentioned above, for an embodiment, processor 110 may be coupled to serial flash memory 200 by way of a serial peripheral interface 115. The term "serial peripheral interface" for an embodiment refers to a de facto standard for serial communications between components in some electronic devices. SPI 115 may comprise a number of signals, as will be discussed more fully below, including a clock signal, input/output signals, and a slave select signal. FIG. 2, as discussed below, depicts one example mode of operation for SPI 115 as it relates to serial flash memory device 200. For the example of FIG. 2, a single input/single output mode of operation is depicted. However, this is merely an example mode of operation, and the scope of claimed subject matter is not limited in this respect. Other possible modes of operation may include, but are not limited to, dual input/output interface operations, and quad input/output interface operations.

For one or more embodiments, storage 400 may comprise a greater number of storage locations than may be identified by a default number of address bits. For an example, storage 400 may comprise 32M or more storage locations. The default SPI protocol allows for twenty-four bits of memory address, permitting the identification of 16M storage locations. Thus, the default twenty-four bit address enables access to a subset of the total memory available in storage 400. Storage locations with the subset may be identified by an address received, for this example, from processor 110. As discussed more fully below, a default address compatible with SPI may comprise 24 bits. Ordinarily, the 24 bit address would be able to identify a maximum of 16M storage locations. However, if more than 24 bits are used to address the storage locations, more than 16M storage locations may be addressed. For an embodiment using an additional 8-bit of address bits to form an extended address, and assuming byte-wide storage locations, the maximum addressable memory space may reach 32 Gb.

For one or more embodiments, in order to maintain compatibility with devices that are limited to 24-bit addresses, serial flash memory device 200 may start up in a default 24-bit address mode, and memory operations may occur according to the standard SPI protocol. Memory device 200 may receive an instruction code from processor 110 indicating that processor 110 is entering an extended address mode, and at least in part in response to receiving the code, memory device 200 may start performing operations using the extended address mode, and processor 110 may access all of the storage locations of memory 200. By starting up system 100 in a default 24-bit address mode, other devices that may share interconnect 115 may also operate in 24-bit address mode. In this manner, devices that do not implement an extended address mode may continue to operate in an extended mode environment.

Also for an embodiment, upon system start-up, processor 110 may poll serial flash memory device 200 to determine whether memory device 200 supports the extended address mode. Processor 110 may, for an embodiment, receive a device identification value from memory device 200. Processor 110 may, for example, access a database to determine whether the device associated with the received identification value supports extended address mode. For another example embodiment, memory device 200 may transmit common flash memory interface (CFI) information to processor 110. The CFI information may include an indication that memory device 200 supports extended address mode. Also, in an embodiment, processor 110 may access boot-up code 222 that may include information related to the capabilities of serial flash memory device 200.

At least in part in response to receiving information that memory device 200 supports extended address mode, processor 110 may transmit to memory device 200 the extended address mode instruction code, and may begin to perform operations with memory device 200 using extended addressing. For an embodiment, an extra byte of address may be utilized, for a total of 32 bits of address. Of course, the scope of claimed subject matter is not limited in these respects.

The increase in addressable memory space while maintaining 24-bit addresses of the default SPI protocol may enable system designers to utilize serial flash memory devices in applications where larger memory spaces are desired, and may do so while maintaining compatibility with devices that do not implement extended addressing. For example, processor 110 may implement extended mode addressing, but may also be compatible with devices that do not support the extended address mode. For one or more embodiments, a combination of devices that do and do not support extended address mode may be supported in the same system. Of course, the memory organizations described herein are merely examples, and the scope of claimed subject matter is not limited in these respects. Also, the SPI protocol is merely an example protocol, and again, the scope of claimed subject matter is not so limited.

FIG. 2 is a block diagram depicting an example embodiment of a serial flash memory device configured for single input/output (I/O) interface operations. Serial flash memory 200 may comprise a terminal Vcc to be coupled to a power source, and a terminal Vpp that may also be coupled to a power source, but which may also have other purposes in other configurations, as discussed below. Memory 200 may also include a terminal Vss that may provide an electrical connection to a ground signal. Serial flash memory 200 for this example may also comprise a data input terminal DI 211 and a data output terminal DO 212, as well as a Reset# signal terminal 201, a clock C signal terminal 203, and a Slave (S#) signal 205. If serial flash memory 200 is operating in the single input, single output mode, information may be shifted into the memory via DI 211, and may be shifted out of the memory via DO 212.

Figure 3:
FIG. 3 is a schematic diagram of an example serial peripheral interface read operation.

FIG. 3 depicts an example command sequence compatible with the SPI protocol for one or more embodiments. Note that for this example, three bytes, or 24 bits, of address are utilized. For an embodiment, an SPI command sequence may begin with a one byte command code that may be initiated with a falling edge of S#205. The 8 bit command code may be latched into DI 211, most significant bit (MSB) first, for an example embodiment, on a rising edge of C 203. Depending on the particular command code, the command code may be followed by additional address bytes, followed by dummy bytes and/or data bytes. The total number of input cycles for a command depends on the particular command code. Further, for this example, address bits may be latched at DI 211 on the rising edge of C. Also, cycles during which undefined (don't care) data are shifted onto DI 211 may be referred to as dummy clock cycles. Also, for an embodiment, as with the command code, the address, dummy, and data bytes are latched at DI 211 most significant bit first, for this example, although the scope of claimed subject matter is not limited in this respect. For the example of FIG. 3, the command sequence is a read operation, and there are no dummy cycles. The command code is received at byte 0, comprising eight clock cycles, and three address bytes are received during the subsequent 24 clock cycles.

Further, for an embodiment, depending upon the particular command code, data bytes may either be latched as input data at DI 211 or transmitted as output data from DO 212. For cycles that input data through DI 211, DO 212 may be set to a high impedance (Z) state. Because for this example the instruction code indicates a read cycle, data is shifted out onto DO 212 during bytes 4 and 5.

Also for an embodiment, a rising edge of S#205 may signal an end to the command sequence and may initiate a resetting of the SPI interface. A de-assertion of S# may also result in a termination of the output data stream for read operations, may bring DO 212 to a high Z state, and may also result in memory 200 entering a standby mode. Of course, these are merely examples of the possible results of a de-assertion of S#205, and the scope of claimed subject matter is not limited in these respects. It should be noted that the operations, command sequences, and serial flash memory device configurations described herein are merely examples, and the scope of claimed subject matter is not limited in this respect.

As can be seen in FIG. 3, for SPI read and write operations, a 24-bit address is used. The 24 bit address provides for identifying 16M storage locations within a memory.

Figure 4:
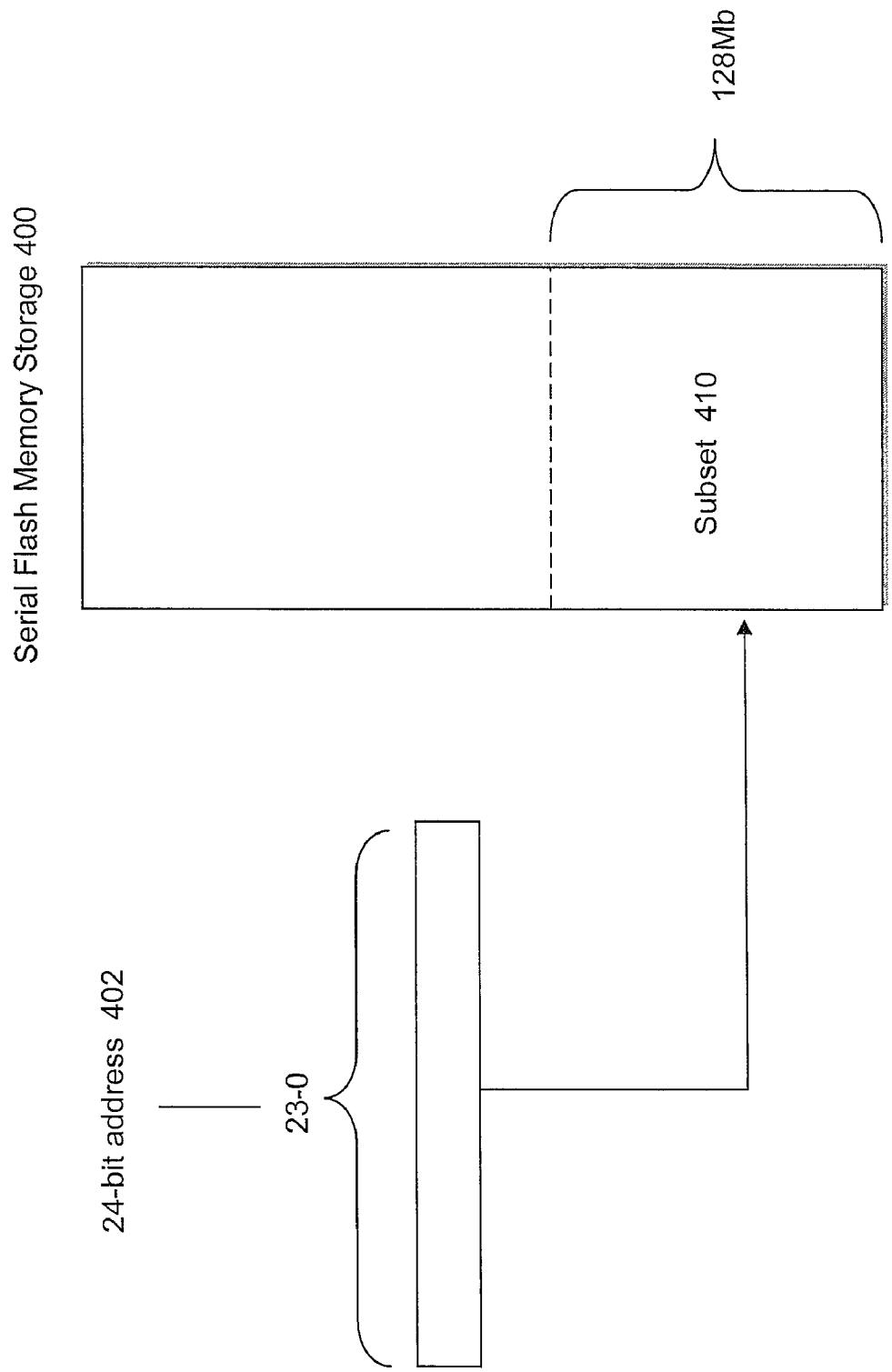
FIG. 4 is a schematic block diagram of an example embodiment of a serial flash memory storage unit.

FIG. 4 depicts a block diagram of an example embodiment of serial flash memory storage unit 400, initially illustrated in FIG. 1. For an embodiment, storage 400 may comprise one or more subsets of storage locations, such as subset 410, that may be addressed using 24-bit address 402. For the example of FIG. 4, one subset is depicted. However, this is merely an example organization of storage 400, and the scope of claimed subject matter is not limited in this respect. For example, other embodiments may incorporate more than one subset. For one or more embodiments, subset 410 may include as many storage locations as can be identified by an address, exclusive of any extended address mode. For example, for a 24-bit address scheme, the subset 410 may comprise 16M storage locations. For embodiments incorporating a byte-wide memory organization, the subset may comprise 128 Mb of storage. Also, for an embodiment, the total memory storage capacity of storage 400 may comprise 512 Mb. However, this is merely an example storage capacity, and the scope of claimed subject matter is not limited in this respect.

For one or more example embodiments, the extended address mode may be entered by a writing an address length configuration command code to serial flash memory device 200. For an embodiment, the address length command code may comprise a value of C2h, although of course the scope of claimed subject matter is not limited in this respect. Also for an embodiment, the default state of serial flash memory device 200 upon power-up is the standard addressing mode utilizing three byte addresses.

FIG. 5 depicts an example command sequence utilizing 32-bit, or four byte, extended addresses. Note that although for this example, four bytes, or 32 bits, of address are utilized, this is merely an example command sequence and an example address length, and the scope of claimed subject matters is not limited in these respects. For an embodiment, an SPI command sequence may begin with a one byte command code that may be initiated with a falling edge of S#205. The 8-bit command code may be latched into DI 211, most significant bit (MSB) first, for an example embodiment, on a rising edge of C 203. Depending on the particular command code, the command code may be followed by additional address bytes, followed by dummy bytes and/or data bytes. The total number of input cycles for a command depends on the particular command code. Further, for this example, address bits may be latched at DI 211 on the rising edge of C. Also, cycles during which undefined (don't care) data are shifted onto DI 211 may be referred to as dummy clock cycles. Also, for an embodiment, as with the command code, the address, dummy, and data bytes are latched at DI 211 most significant bit first, for this example, although the scope of claimed subject matter is not limited in this respect. For the example of FIG. 5, the command sequence is a read operation, and there are no dummy cycles. The command code is received at byte 0, comprising eight clock cycles, and four address bytes are received during the subsequent 32 clock cycles.

Further, for an embodiment, as with embodiments previously described, depending upon the particular command code, data bytes may either be latched as input data at DI 211 or transmitted as output data from DO 212. For cycles that input data through DI 211, DO 212 may be set to a high impedance (Z) state. Because for this example the instruction code indicates a read cycle, data is shifted out onto DO 212 during bytes 5 and 6.

As can be seen in FIG. 5, for extended address mode read and write operations, a 32-bit address is used. The 32-bit address provides for identifying up to approximately 32 billion storage locations within a memory. Of course, the 32-bit extended address mode is merely an example, and the scope of claimed subject matter is not limited in this respect.

Figure 6:
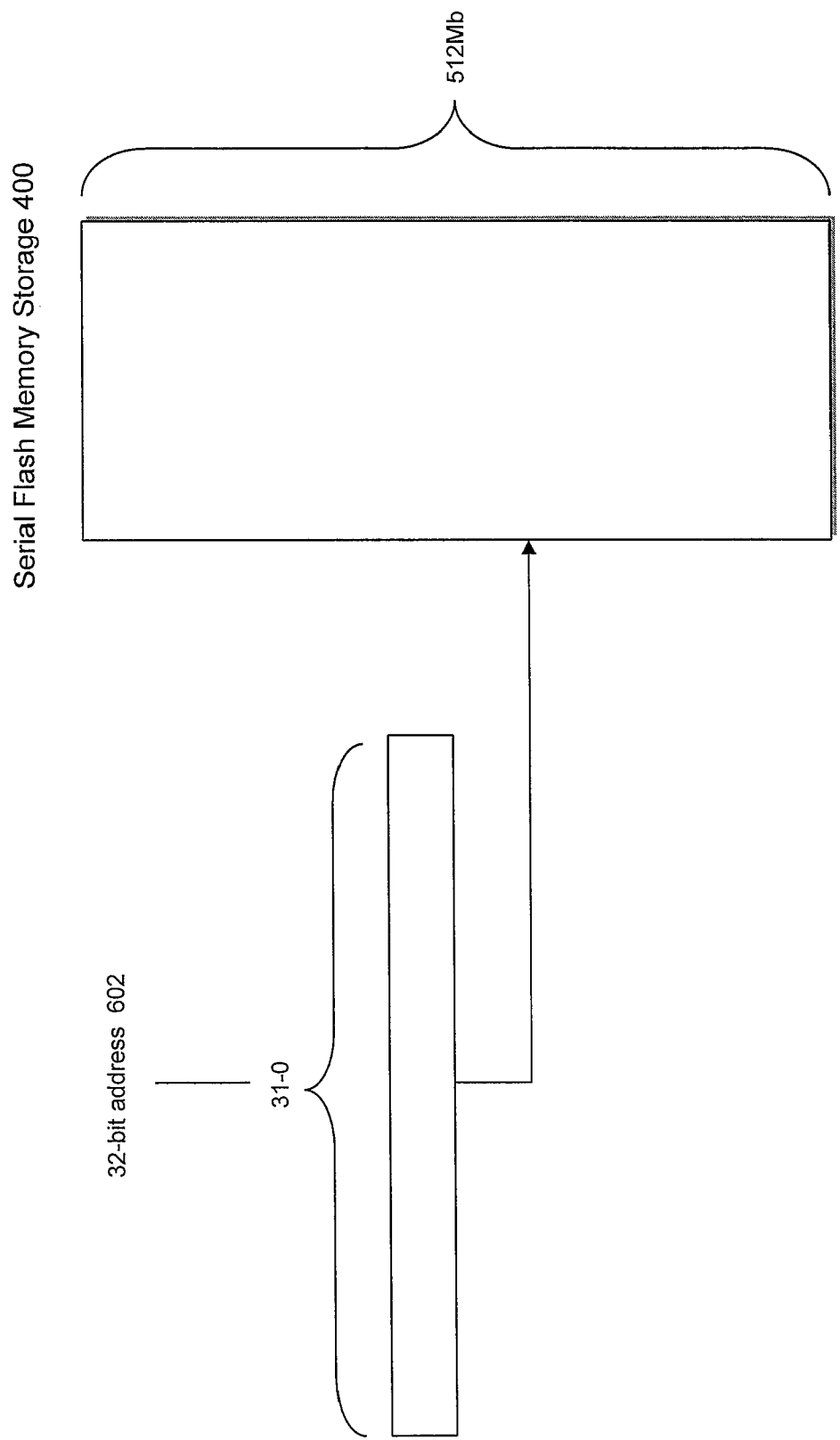
FIG. 6 is a schematic block diagram of an example embodiment of a serial flash memory storage unit.

FIG. 6 depicts a block diagram of an example embodiment of serial flash memory storage unit 400, initially illustrated in FIG. 1. For an embodiment, storage 400 may comprise a contiguous block of memory comprising 512 Mb of storage that may be addressed using 32-bit address 602. However, this is merely an example organization of storage 400, and the scope of claimed subject matter is not limited in this respect. For embodiments incorporating a byte-wide memory organization, storage 400 may comprise 64M of storage locations that may be addressed using the extended addresses. Also, for the example embodiment depicted in FIG. 6, the total memory storage capacity of storage 400 may comprise 512 Mb. However, this is merely an example storage capacity, and the scope of claimed subject matter is not limited in this respect. Of course, for other embodiments, a wide range of storage capacities are possible. For example, a 32-bit address may provide addressing for up to 32G of storage locations, for up to a total capacity of 256 Gb for a byte-wide memory device.

FIG. 7 is a flow diagram of an example embodiment of a method for enhancing addressability for a serial flash memory device. At block 710, one or more memory operations may be performed at a serial flash memory device using a default addressing mode providing access to a subset of a plurality of memory locations. At block 720, a plurality of memory operations may be performed at the memory device using an extended addressing mode providing access to the plurality of memory locations at least in part in response to receiving an address length configuration command code. Thus, with the standard addressing, only a subset of the total memory capacity may be accessed, and with the extended address mode, the entire capacity may be accessed. Of course, the above is merely an example of enhancing addressability of serial flash memory devices, and the scope of claimed subject matter is not limited to these specific details. For example, embodiments in accordance with claimed subject matter may include all, less than, or more than, blocks 710-720. Also, the order of blocks 710-720 is merely and example order, and the scope of claimed subject matter is not limited in this respect.

Of course, the extended address mode, control unit, configuration register, and storage unit configurations and organizations discussed above are merely examples, and a wide range of alternative embodiments are possible. The scope of claimed subject matter is not limited to the specific detail of the example embodiments described herein. For example, although embodiments described herein mention 24-bit default addresses and 32-bit extended addresses, the scope of claimed subject matter is not limited in these respects, and other address sizes may be utilized, for one or more embodiments.

In the preceding description, various aspects of claimed subject matter have been described. For purposes of explanation, systems or configurations were set forth to provide an understanding of claimed subject matter. However, claimed subject matter may be practiced without those specific details. In other instances, well-known features were omitted or simplified so as not to obscure claimed subject matter. While certain features have been illustrated or described herein, many modifications, substitutions, changes or equivalents will now occur to those skilled in the art. It is, therefore, to be understood that the appended claims are intended to cover all such modifications or changes as fall within the true spirit of claimed subject matter.

The invention claimed is:

1. A method of providing extended memory addressing in a compatible manner, the method comprising:
   in a serial flash memory device in which both addresses and data are communicated serially, initially entering a default addressing mode corresponding to a standard upon power-up for conformity with the standard, wherein addressing with the default addressing mode permits addressing of only a subset of memory locations of the serial flash memory device, wherein the subset of memory locations is smaller than the total memory locations;
   performing read and write memory operations at the serial flash memory device using the default addressing mode when no command for an extended addressing mode is received;
   entering the extended addressing mode and performing read and write memory operations at the serial flash memory device using the extended addressing mode comprising an extended number of address bits providing access to a set of memory locations larger than and including the subset of memory locations at least in part in response to receiving an address length configuration command code from a processor; and
   serially receiving addresses for the read and write memory operations from the processor.

2. The method of claim 1, wherein the default addressing mode comprises a twenty-four bit addressing mode.

3. The method of claim 2, wherein the standard comprises a serial peripheral interface protocol.

4. The method of claim 2, wherein the extended addressing mode comprises a thirty-two bit addressing mode.

5. The method of claim 4, wherein the extended addressing mode comprises a thirty-two bit addressing mode compatible with a serial peripheral interface protocol.

6. The method of claim 1, further comprising transmitting a device identification value to a processor at least in part in response to a device identification read operation initiated by the processor, the device identification value to indicate at least in part that the serial flash memory device is capable of performing extended addressing mode operations.

7. The method of claim 1, further comprising transmitting common flash memory interface (CFI) information to a processor at least in part in response to a CFI read operation initiated by the processor, the CFI information to indicate at least in part that the serial flash memory device is capable of performing extended addressing mode operations.

8. The method of claim 1, further comprising transmitting boot-up code to a processor at least in part in response to a read operation initiated by the processor, the boot-up code to indicate at least in part that the serial flash memory device is capable of performing extended addressing mode operations.

9. A serial flash memory device, comprising:
   a plurality of memory locations; and
   a control unit configured to receive addresses serially, to receive data for writes serially, and to provide data for reads serially, the control unit configured to perform read and write memory operations in a default addressing mode when no command for an extended addressing mode is received, the default addressing mode having a default number of address bits providing access to a subset of memory locations, the control unit further configured to perform read and write memory operations in an extended addressing mode at least in part in response to receiving an address length configuration command code, the extended addressing mode having an extended number of address bits providing access to a set of memory locations larger than and including the subset of memory locations.

10. The serial flash memory device of claim 9, wherein the default addressing mode comprises a twenty-four bit addressing mode.

11. The serial flash memory device of claim 10, wherein the default addressing mode comprises a twenty-four bit addressing mode compatible with a serial peripheral interface protocol.

12. The serial flash memory device of claim 10, wherein the extended addressing mode comprises a thirty-two bit addressing mode.

13. The serial flash memory device of claim 12, wherein the extended addressing mode comprises a thirty-two bit addressing mode compatible with a serial peripheral interface protocol.

14. The serial flash memory device of claim 9, further comprising an output terminal to transmit a device identification value to a processor at least in part in response to a device identification read operation initiated by the processor, the device identification value to indicate at least in part that the serial flash memory device is capable of performing extended addressing mode operations.

15. The serial flash memory device of claim 9, further comprising an output terminal to transmit common flash memory interface (CFI) information to a processor at least in part in response to a CFI read operation initiated by the processor, the CFI information to indicate at least in part that the serial flash memory device is capable of performing extended addressing mode operations.

16. The serial flash memory device of claim 9, further comprising an output terminal to transmit boot-up code to a processor at least in part in response to a read operation initiated by the processor, the boot-up code to indicate at least in part that the serial flash memory device is capable of performing extended addressing mode operations.

17. A system, comprising:
   a processor; and
   a serial flash memory device coupled to the processor, the memory device comprising
      a plurality of memory locations, and
      a control unit configured to receive addresses serially, to receive data for writes serially, and to provide data for reads serially, the control unit configured to perform read and write memory operations in a default addressing mode when no command for an extended addressing mode is received, the default addressing mode having a default number of address bits providing access to a subset of the plurality of memory locations, the control unit further configured to perform read and write memory operations in an extended addressing mode at least in part in response to receiving an address length configuration command code from the processor comprising an extended number of address bits providing access to a set of the plurality of memory locations larger than and including the subset of memory locations.

18. The system of claim 17, wherein the default addressing mode comprises a twenty-four bit addressing mode compatible with a serial peripheral interface protocol.

19. The system of claim 18, wherein the extended addressing mode comprises a thirty-two bit addressing mode.

20. The system of claim 17, the memory device further comprising an output terminal to transmit addressing mode capability information to the processor at least in part in response to a read operation initiated by the processor, the addressing mode capability information to indicate at least in part that the memory device is capable of performing extended addressing mode operations.

* * * * *